United States Patent
Murphy et al.

(10) Patent No.: US 11,662,950 B2
(45) Date of Patent: *May 30, 2023

(54) SPECULATION IN MEMORY

(71) Applicant: Micron Technology, Inc., Boise, ID (US)

(72) Inventors: Richard C. Murphy, Boise, ID (US); Glen E. Hush, Boise, ID (US); Honglin Sun, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/501,161

(22) Filed: Oct. 14, 2021

(65) Prior Publication Data

US 2022/0035571 A1    Feb. 3, 2022

Related U.S. Application Data

(63) Continuation of application No. 16/539,509, filed on Aug. 13, 2019, now Pat. No. 11,169,737.

(51) Int. Cl.
*G06F 3/06* (2006.01)
*G06F 12/02* (2006.01)
(Continued)

(52) U.S. Cl.
CPC .......... *G06F 3/0659* (2013.01); *G06F 3/0622* (2013.01); *G06F 3/0688* (2013.01); *G06F 9/3013* (2013.01); *G06F 9/30196* (2013.01); *G06F 9/544* (2013.01); *G06F 12/0246* (2013.01)

(58) Field of Classification Search
CPC .... G06F 3/0659; G06F 3/0622; G06F 3/0688; G06F 9/3013; G06F 9/30196; G06F 9/544; G06F 12/0246; G06F 2212/1016; G06F 12/0215; G06F 3/0611; G11C 7/1057; G11C 7/1084
See application file for complete search history.

(56) References Cited

U.S. PATENT DOCUMENTS 5,050,095 A    9/1991 Samad
5,875,347 A *  2/1999 Watanabe ............... G06N 3/063
                                                    712/1
(Continued)

FOREIGN PATENT DOCUMENTS

| CN | 102270176 A | 12/2011 |
| JP | 2005174342 A | 6/2005 |
| KR | 10-2014-0132424 A | 11/2014 |

OTHER PUBLICATIONS

International Search Report and Written Opinion from related International Application No. PCT/US2020/040488, dated Oct. 19, 2020, 12 pages.

*Primary Examiner* — Francisco A Grullon
(74) *Attorney, Agent, or Firm* — Brooks, Cameron & Huebsch, PLLC

(57) ABSTRACT

The present disclosure is related to performing speculation in, for example, a memory device or a computing system that includes a memory device. Speculation can be used to identify data that is accessed together or to predict data that will be accessed with greater frequency. The identified data can be organized to improve efficiency in providing access to the data.

20 Claims, 4 Drawing Sheets

(51) Int. Cl.
    *G06F 9/30*    (2018.01)
    *G06F 9/54*    (2006.01)

(56) References Cited

U.S. PATENT DOCUMENTS

| | | | |
|---|---|---|---|
| 6,052,760 | A | 4/2000 | Bauman et al. |
| 6,970,985 | B2 | 11/2005 | Moritz |
| 7,043,466 | B2 | 5/2006 | Watanabe et al. |
| 7,089,400 | B1 | 8/2006 | Pickett et al. |
| 7,526,604 | B1 * | 4/2009 | Danilak ............... G06F 12/0862 711/112 |
| 8,892,821 | B2 | 11/2014 | Arimilli et al. |
| 9,886,384 | B2 | 2/2018 | Kim et al. |
| 2004/0073764 | A1 * | 4/2004 | Andreasson ........ G06F 12/0253 711/170 |
| 2005/0132148 | A1 * | 6/2005 | Arimilli ............... G06F 12/0215 711/E12.004 |
| 2007/0204111 | A1 | 8/2007 | Khare et al. |
| 2009/0106498 | A1 | 4/2009 | Lepak et al. |
| 2014/0136754 | A1 * | 5/2014 | Hyde .................. G06F 11/3037 711/103 |
| 2016/0371187 | A1 * | 12/2016 | Roberts ............... G06F 12/0835 |
| 2018/0189635 | A1 * | 7/2018 | Olarig .................. G06N 3/0454 |
| 2019/0129834 | A1 | 5/2019 | Purkayastha et al. |
| 2019/0347125 | A1 | 11/2019 | Sankaran et al. |
| 2021/0056043 | A1 | 2/2021 | Grisenthwaite |
| 2021/0149583 | A1 | 5/2021 | Agarwal et al. |

* cited by examiner

SPECULATION IN MEMORY

PRIORITY INFORMATION

This application is a Continuation of U.S. application Ser. No. 16/539,509, filed on Aug. 13, 2019, the contents of which are incorporated herein by reference.

TECHNICAL FIELD

The present disclosure relates generally to memory, and more particularly to apparatuses and methods associated with performing speculation in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

Various computing systems include a number of processing resources that are coupled to memory (e.g., a memory system), which is accessed in association with executing a set of instructions (e.g., a program, applications, etc.). Processing resources can perform speculation to optimize the execution of a set of instructions. Speculation, as performed by the processor, can be used to perform a set of instructions before it is determined whether the set of instructions are needed. Speculation can streamline the execution of a set of instructions by a processor.

DETAILED DESCRIPTION

Figure 1:
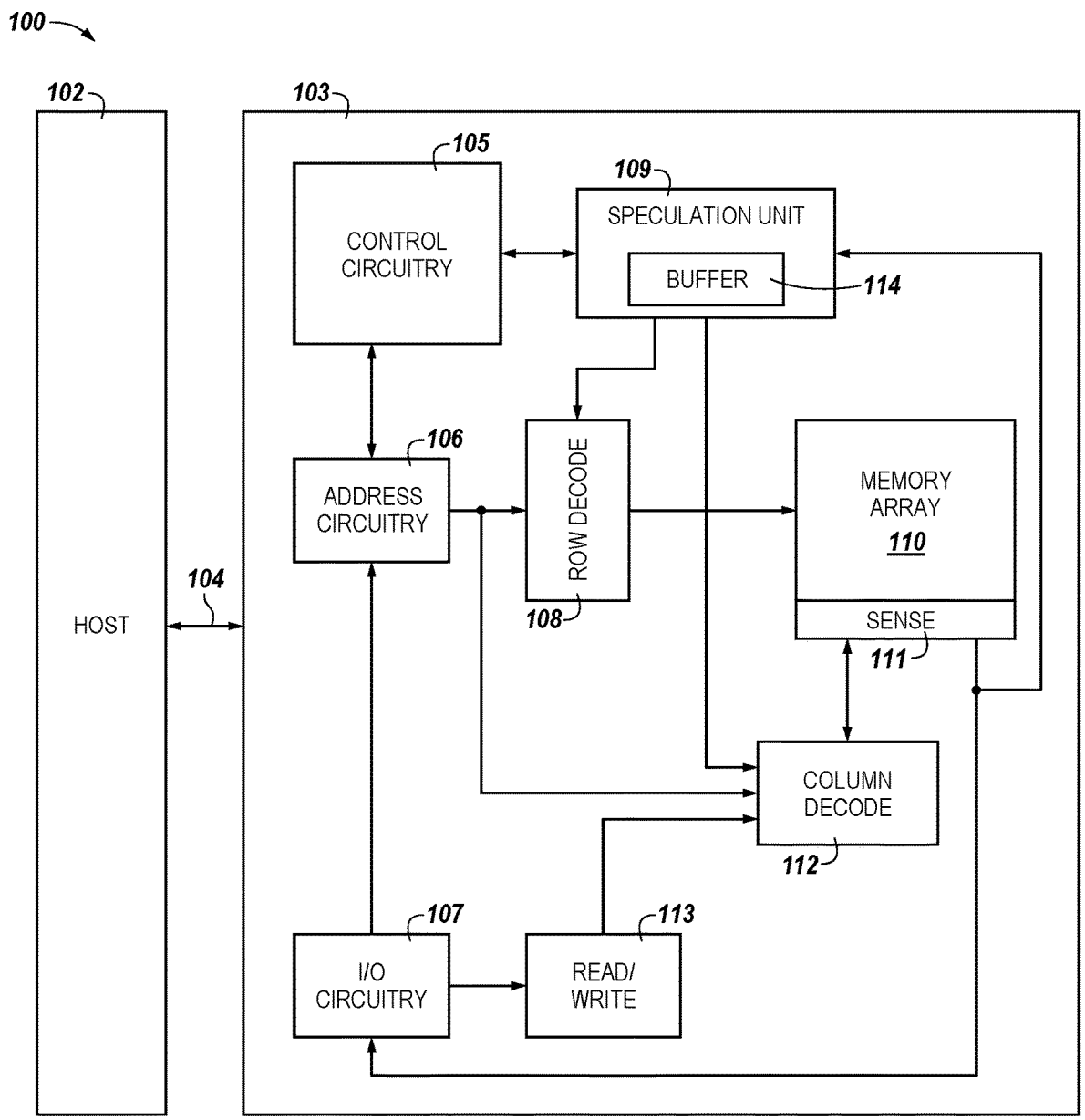
FIG. 1 is a block diagram of an apparatus in the form of a computing system including a memory device in accordance with a number of embodiments of the present disclosure.

The present disclosure includes apparatuses and methods related to performing speculation in memory. The transfer of data may be a limiting factor to the execution of instructions. For instance, the transfer of data between a processing device and a memory device may limit the processing device's ability to perform operations on the data being transferred. To reduce the time used to transfer data between the processing device and the memory device, the possessing device may perform speculation.

Speculation, as performed by the processing device, can be used to optimize execution. For instance, a processing device may calculate multiple different execution paths prior to knowing which of the execution paths will be utilized. Responsive to determining which of the execution paths is utilized, the processing device may discard a portion of the execution paths and may retain the execution path utilized. Calculating the different execution paths prior to identifying an execution path to utilize may allow the processing device to be utilized while the processing device may otherwise be unutilized.

Speculation can also be performed in memory to reduce the power utilized by the memory device and to decrease the time utilized to access data from the memory device. Speculation can be performed in memory by utilizing access commands to identify data in a memory array that can be organized to reduce the quantity of access commands used to retrieve that data. Data (e.g., statistical data) can be generated based on access commands received at a memory device. The data can define addresses of a memory array that are most accessed, patterns of data access, and/or predictions of data to be accessed from the memory array.

As used herein, an access command can include a number of commands. An access command can be a pre-charge command, an activate command, a read command, and/or a write command, among other possible commands that are related to accessing data from memory.

Although the examples described herein are provided in the context of access commands, speculation can be performed utilizing different types of commands including the access commands. For example, data (e.g., statistical data) can be gathered from power commands and access commands.

Patterns of data access can include patterns associated with addresses of the memory array. For instance, patterns of data access can describe that a second addressed is accessed after a first address. Upon receipt of the first address the memory device may speculate that the second address will be accessed next. The memory device can organize the first address and the second address such that the first address and the second address can be accessed utilizing a single access command instead of multiple access commands. Energy is saved and retrieval speed is reduced by reducing the quantity of access commands used to retrieve data.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 120. The system 100 can include separate integrated circuits, or both the host 102 and the memory device 103 can be on the same integrated circuit. For example, the host 102 may be a system controller of a memory system comprising multiple memory devices 103, with the system controller 102 providing access to the respective memory devices 103 by another processing resource such as a central processing unit (CPU).

In the example shown in FIG. 1, the host 102 is responsible for executing an operating system (OS) and/or various applications (e.g., processes) that can be loaded thereto (e.g., from memory device 103 via controller 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although a single array 110 is shown in FIG. 1, embodiments are not so limited. For instance, memory device 103 may include a number of arrays 110 (e.g., a number of banks of DRAM cells).

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z, CCIX, or the like. Address signals are received and decoded by a row decoder 108 and a column decoder 112 to access the memory array 110. Data can be read from memory array 110 by sensing voltage and/or current changes on the sense lines using sensing circuitry 111. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the read/write circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device.

The control circuitry 105 can be coupled to a speculation unit 109. The speculation unit 109 can be circuitry configured to perform speculation. Performing speculation can describe operations utilized in speculating data to be accessed. The speculation unit 109 can comprise a buffer 114. The buffer 114 can store data from the memory array 110. The speculation unit 109 can move data from the memory array 110 to the buffer 114 to reduce the quantity of access commands utilized to access the data. Access commands can be fulfilled by providing data from the buffer 114 instead of the memory array 110.

The speculation unit 109 can also organize the data stored in the memory array 110. Organizing data stored in the memory array 110 can include transferring the data from the memory array 110 to the buffer 114 and/or moving data from one portion of the memory array 110 to a different portion of the memory array 110. Although the speculation unit 109 is shown as being external to the control circuitry 106, the speculation unit 109 and/or the buffer 114 can also be a part of the control circuitry 105.

The speculation unit 109 can be coupled to the row decoder 108 and/or the column decoder 112 to control the memory array 110. The speculation unit 109 can control the memory array 110 to activate rows and columns of the memory array 110. The speculation unit 109 can activating rows and columns of the memory array 110 to access data stored in the memory array 110. The data stored in the memory array can be accessed to move the data from a first address of the memory array 110 to a second address of the memory array 110 or to move data from the memory array 110 to the buffer 114.

The speculation unit 109 can request control of the memory array 110 from the control circuitry 105. The speculation unit 109 can receive control of the memory device 103 to transfer data from a first portion of the memory array 110 to a second portion of the memory array and/or by moving data from the memory array 110 to the buffer 114. Responsive to granting control of the memory array 110, the control circuitry 106 can refrain from interacting with the memory array 110. For example, the control circuitry 106 may refrain from activating rows and/or columns of the memory array 110. The speculation unit 109 may relinquish control of the memory device 103 responsive to having transferred data from the memory array 110 to the buffer 114 and/or responsive to moving data from a first portion of the memory array 110 to a second portion of the memory array.

The buffer 114 can be a dedicated buffer utilized to satisfy access commands which have been speculated. In various instances, the buffer 114 can be a shared buffer which can be utilized for various purposes in addition for satisfying access commands which have been speculated by the speculation unit 109.

Figure 2:
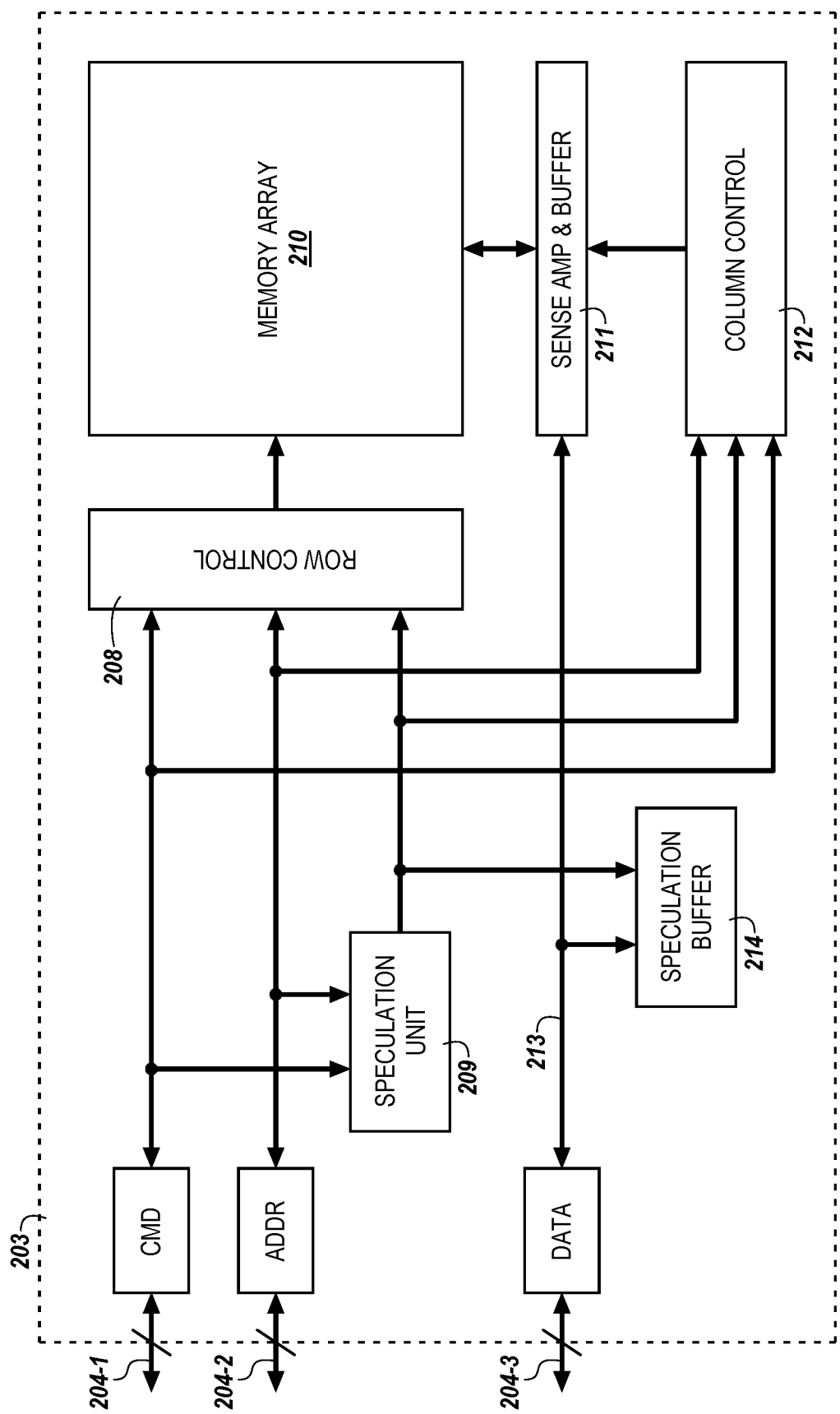
FIG. 2 is a block diagram of an apparatus in the form of a memory device in accordance with a number of embodiments of the present disclosure.

FIG. 2 is a block diagram of an apparatus in the form of a memory device 203 in accordance with a number of embodiments of the present disclosure. The memory device 203 is analogous to the memory device 103 in FIG. 1. The memory device 203 comprises a speculation unit 209 and a speculation buffer 214. The memory device 203 also comprises a row control 208, a memory array 210, a sense amplifier 211 (e.g., sense amplifier and buffers), and a column control 212. The row control 208 and the column control 212 can be analogous to the row decoder 108 and the column decoder 112 in FIG. 1.

The memory device 203 can receive and/or provide data through the interfaces 204-1, 204-2, and 204-3. The interface 204-1 can be a command bus, the interface 204-2 can be an address bus, and the interface 204-3 can be a data bus. The interface 204-1 can be used for bidirectional communications of commands. The interface 204-2 can be used for bidirectional communications of addresses. The interface 204-3 can be used for bidirectional communication of data previously stored in or to be stored in the memory array 210.

The speculation unit 209 can access commands, data, and/or addresses provided via the interfaces 204-1, 204-2, and 204-3, referred to as interfaces 204. The speculation unit 209 can intercept the commands, data, and/or addresses as they are received by the memory device 203. Intercepting the commands, data, and/or addresses can include accessing the commands, data, and/or addresses independent of their delivery to different devices/portions of the memory device 203. For example, the memory device 203 may receive commands via the interface 204-1 via a control unit 105 in FIG. 1. The speculation unit 209 may access the commands independent of the commands being received by the control unit such that both the control unit and the speculation unit 209 receive the commands. In examples where the speculation unit 209 is implemented as part of the control circuitry, the speculation unit 209 can snoop the access commands received by the control circuitry. As used herein, snooping can refer to the interception of access commands that are otherwise being utilized. For instance, an access command can be snooped while the access command is being utilized to provide access to a memory array. Snooping can also include the utilization of an access command for a purpose other than accessing data from the memory array. For instance, the access command can be utilized to generate statistical data about the date most likely to be accessed from the memory array.

The speculation unit 209 can process the commands, associated addresses, and/or data to generate data that can be used to determine data stored in the memory array that will be accessed. For instance, the speculation unit 209 can process the commands, addresses, and/or data to generate statistical data. The statistical data can be used to determine an access command that is likely to be received next. Processing the commands, addresses, and/or data can be used to identify patterns that can be used to predict future data access from the memory array. Predicting future data access can be referred to as speculation. The speculation unit 209 can speculate data accesses, access commands, and/or addresses to be received at the control unit and/or to be received by the control unit.

The speculation unit 209 can utilize a quantity of access commands to predict future data accesses. For instance, the speculation unit 209 can utilize an access command to predict future data accesses or a plurality of access commands to predict future data accesses.

The predicted future data accesses can be in the form of predicting addresses from a memory array to be accessed. The predicted future data accesses can also be in the form of predicted access commands to be received by the memory command or predicting a type of data to be accessed. For instance, the speculation unit 209 can predict that the next four commands received by the memory device 203 are access commands. The speculation unit 209 can predict the addresses corresponding to the next four access commands. The speculation unit 209 can predict a type of data to be accessed by the next four access commands to be received by the memory device. For instance, the speculation unit 209 can predict that the next access command will request data comprised of 0-bits.

The speculation unit 209 can identify a pattern of addresses to be accessed. For instance, the speculation unit 209 can predict a first address to be accessed followed by a second address to be accessed. The speculation unit 209 can identify a trigger after which the first and then the second addresses are accessed.

In some examples, the speculation unit 209 can predict data access based on threshold counters. The speculation unit 209 can track the frequency of access to a particular portion of the memory array 210. Responsive to reaching a threshold of the quantity of accesses to a portion of the memory array 210 in a portion of time, the speculation unit 209 can move the data from the memory array 210 to the buffer 214, for example.

The statistical data gathered by the speculation unit 209 can be time dependent and/or command dependent. Accordingly, as time lapses and/or as new commands are received by the memory device 203, prior data gathered from the commands may carry less weight than current data gathered from current commands. Based on updating the statistical data gathered by the speculation unit 209, the data stored in buffer 214 may change based on the updating of the statistical data. Responsive to predicting the data access, the speculation unit 209 can organize the data in the memory array 210 to reduce the quantity of access commands used to access the data or to reduce the time utilized to provide the data. Organizing the data can include moving data from a first portion of the memory array 210 to a second portion of the memory array 210. For example, the first address and the second address can be remapped to a same row and/or the first address and the second address may be remapped to be continuous addresses. Organizing the first address and the second address can be accessed utilizing a single access command by remapping the first and/or second addresses such that they are in a same page of data accessed by the access command. Organizing the data can also include moving data from the memory array 210 to the buffer 214.

The buffer 214 can be coupled to the sense amplifier via a number of data lines. The size of the buffer 214 can correspond to the size of the sense amplifiers 211. For instance, the buffer 214 can store a quantity of data equal to the quantity of data latched by the sense amplifiers 211. The buffer 214 can store a quantity of data equal to a multiple of the quantity of data latched by the sense amplifiers 211. The buffer 214 can store data utilizing registers, cells, and/or different types of charge storage devices.

Moving the data from the memory array 210 to the buffers 214 can include reading a number of pages of data from the memory array 210. For instance, a first portion of a first page can be stored in a first portion of a buffer 214 and a second portion of a second page of the memory array 210 can be stored in a second portion of the buffer 214 to allow the first portion of the first page and the second portion of the second page to be accessed together utilizing a single access command. The first portion of the first page and the second portion of the second page can be stored in the specification buffer 214 to reduce the quantity of time utilized to access the first portion of the first page and the second portion of the second page. For instance, storing the first portion of the first page in the buffer 214 can reduce the time utilized to access the first portion of the first page by eliminating the need to move the first portion of the first page from the memory array 210 to the data lines 213 at the time a corresponding access command is processed.

The speculation unit 209 may store the memory array addresses corresponding to the data stored in the specification buffer 214 to identify the data stored in the buffer 214. The speculation unit 209 can monitor access commands received by the memory device 203. The speculation unit 209 can request control of the memory device 203 and can transfer the data from the buffer 214 to the interface 204-3 if a received access command is associated with an address of data stored in the buffer 214.

In some examples, the control circuitry can transfer the data from the specification buffer 214 to the interface 204-3. The control circuitry can transfer the data by communicating directly with the buffer 214 and/or by requesting that the specification unit 209 move the data from the buffer 214 to the interface 204-3.

Although FIG. 2 shows the buffer 214 as being external to the speculation unit 209, the buffer 114 can also be internal to the speculation unit 109 as shown in FIG. 1. Either an internal buffer and/or an external buffer can be implemented and utilized with the examples described herein.

Figure 3:
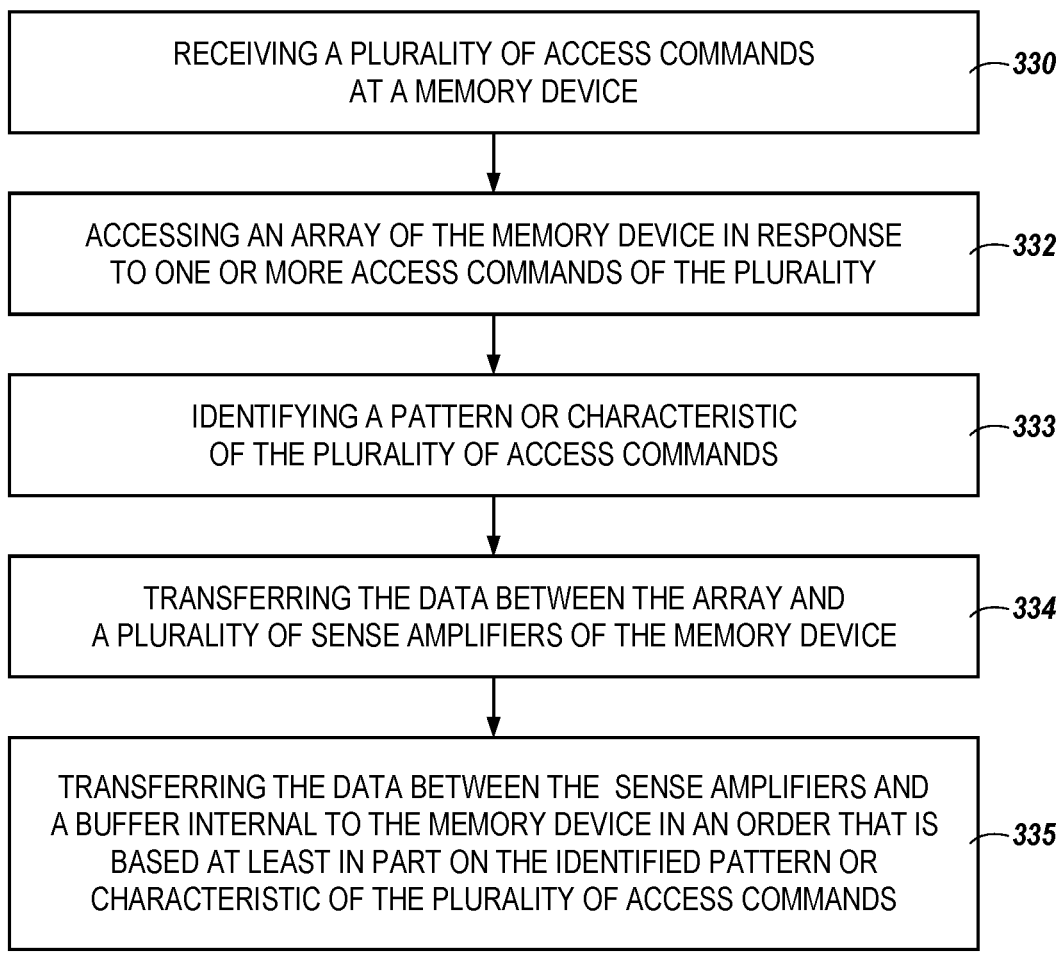
FIG. 3 illustrates an example flow diagram of a method for performing speculation in memory in accordance with a number of embodiments of the present disclosure.

FIG. 3 illustrates an example flow diagram of a method for performing speculation in memory in accordance with a number of embodiments of the present disclosure. At 330, a plurality of access commands can be received at a memory device. The memory device can provide access to a memory array responsive to receipt to the access commands.

At 332, the memory array can be accesses in response to one or more of the access commands from the plurality. At 334, a pattern or characteristic corresponding to the one or more of the access commands can be identified. The pattern can describe a frequency of access and/or a relationship between access commands, among other patterns or characteristics.

At 336, the data accessed can be transferred from the array to a plurality of sense amplifiers coupled to the array. At 338, the data can be transferred between the sense amplifiers and a buffer internal to the memory device in an order that is based at least in part on the identified pattern or characteristic of the plurality of access commands.

In some examples, the patterns and/or characteristics of the plurality of access commands can used to identify portions of the data. Said portions of the data can be transferred to the buffer from the sense amplifiers in an identified by the pattern and/or characteristic. For example, a pattern and/or characteristic can identify a first portion of a plurality of bits that comprise a row of data. The first portion of the row of data can be transferred to a buffer while other portions of the row of data are not transferred to the buffer.

The pattern or characteristic of the plurality of access commands is identified by storing addresses corresponding to the plurality of access commands in registers and maintaining counters corresponding to the addresses.

Responsive to receipt of the one or more access commands of the plurality of access commands, a determination can be made that an address associated with the one or more access command corresponds to the data stored in the buffer. The control circuitry or the speculation unit can compare the address associated with the received access command with the addresses of data stored in the buffer and/or with the addresses of data organized in the memory array. For instance, if a first portion of the memory array is stored in a second portion of the memory array as a result of performing speculation, then the addresses received and corresponding to the first portion of the memory array can be mapped to the second portion of the memory array. The speculation unit can request control of the memory device to return the data having a mapped addressed.

The speculation unit can, responsive to determining that the address corresponds to the particular data stored in the buffer, provide access to the particular data stored in the buffer. Access can be provided by moving the particular data from the buffer through the data lines to the data interface of the memory device.

If the address associated with the received access command does not correspond to the particular data stored in the buffer, access can be provided to the memory array without mapping the address to the buffer or to an address of the memory array. The address received with the access command can be utilized to access the memory array directly. If the received address is not mapped to the buffer, then the control circuitry and/or the speculation unit can provide access to the received address of the memory array.

In various examples, the plurality of access commands can be processed to identify data that is likely to be accessed by a next received access command. The speculation unit can speculate a next address (e.g., data stored in the address) to be accessed.

In various instances, control circuitry can be configured to receive a plurality of commands. Circuitry (speculation unit) can further be configured to snoop the plurality of commands, generate first data based on the plurality of commands, and organize second data stored in the memory array based on the first data and/or a prediction of the memory access. The first data can also be referred to as statistical data. The statistical data can be formed based on counters of the type of data, the addresses of the memory array, and/or the types of commands received at the memory device.

For example, the memory device can increment a counter associated with a row each time an access command corresponding to that row is received. Based on the update of a plurality of counters, the memory device can identify the row of an array that are accessed with the greatest frequency over a period of time or over a quantity of access commands. For instance, the memory device can utilize the counters to generate statistical data that identifies that a first and a second row are accessed with a greater frequency than the remainder of the rows of an array. The frequency of access of a row can be considered a pattern. The pattern being which rows are accessed with a greater frequency. The statistical data can be a percentages of access commands corresponding to rows of the memory array.

In some examples, the statistical data can identify how often a row is accessed after data is stored in the row. For instance, the speculation unit can identify rows that are written to and can count the quantity of access commands that follow the storing of data in said rows. If the count used to track the access of the row following the storing of data in a row less than a threshold, then the data may be organized in the memory array or moved to a buffer with the expectation that future access commands will target said row.

A plurality of registers can be used to track the counts and addresses of the array. The addresses can include row addresses and/or column addresses. The speculation unit may utilize comparators to match incoming addresses to the addresses stored in the array. The speculation unit may also increment counters associated with the addresses stored in the registers given a match between incoming addresses and addresses stored in the registers. A speculation unit may also maintain a que to keep records up to date. For example, the que may be used to vacate registers that are associated with addresses that have not been accessed in a quantity of prior accesses to the memory.

In various examples, the speculation unit may maintain a finite state machine (FSM) and/or a sequencer to dynamically record or evict records in the plurality of register used to track the address of the array or counters. The speculation unit may utilize registers as a buffer. The row address buffer used to track the address of an array that are accessed and/or associated counters may be greater than a buffer (e.g., row data buffer) used to store data corresponding to rows of the array. However, the row address buffer may be associated with the row data buffer given that each entry in the row data buffer may correspond to an entry in the row address buffer such that as entries in the row address buffer are evicted so are the corresponding entries in the row data buffer.

A memory address can be predicted based on the first data. For instance, if the statistical data identifies an address as having been accessed with a greatest frequency, then the specification unit can predict that the address will be access based on the first data.

Based on the predicted memory access, the second data stored in the memory array can be organized to reduce a quantity of accesses used to retrieve the second data. In some instances, the quantity of accesses used to retrieve the second data may not change responsive to predicting the memory access. However, the duration of time utilized to provide access to the second data may be reduced.

In some examples, the mapping between the addresses of the memory array and/or between addresses of the memory array and a speculation buffer can be performed prior to organizing the data corresponding to the addresses. Addresses of the memory array and corresponding to the second data can be mapped prior to being organized to addresses of the memory array corresponding to the second data after being organized. That is, the mapped addresses can identify the addresses of data before the data is moved and the addresses of data after the data is moved.

The statistical data can identify data that is accessed together or subsequently. The statistical data can be used to identify the two or three most often accessed data. The statistical data can be used to identify the most often accessed data and the order in which the data is accessed. In some examples, the control circuitry and the circuitry (speculation unit) can be implemented in separate integrated circuitries or in a single integrated circuitry.

Figure 4:
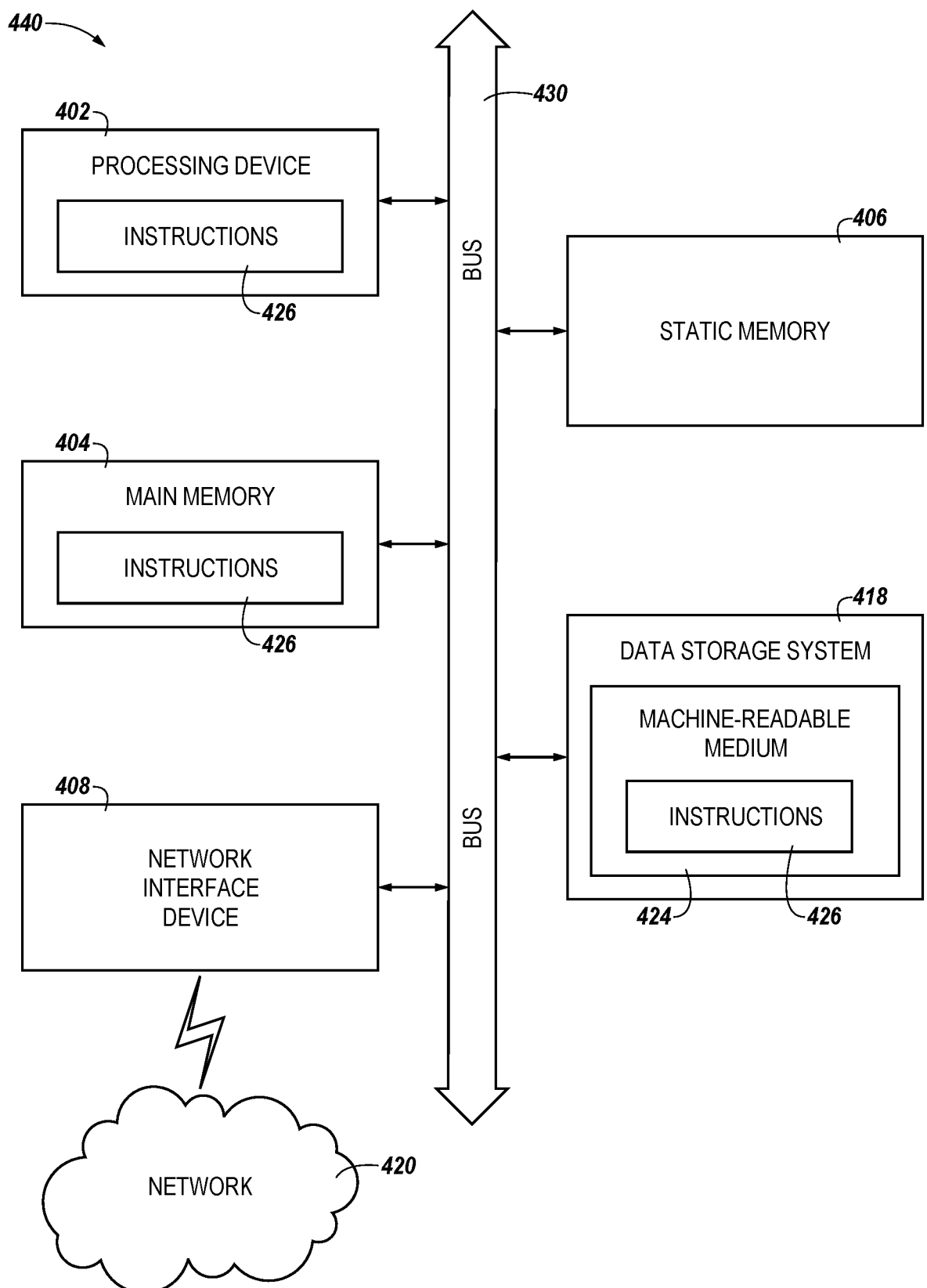
FIG. 4 illustrates an example machine of a computer system within which a set of instructions, for causing the machine to perform various methodologies discussed herein, can be executed.

FIG. 4 illustrates an example machine of a computer system 440 within which a set of instructions, for causing the machine to perform various methodologies discussed herein, can be executed. In various embodiments, the computer system 440 can correspond to a system (e.g., the system 100 of FIG. 1) that includes, is coupled to, or utilizes a memory sub-system (e.g., the memory device 103 of FIG. 1) or can be used to perform the operations of a controller (e.g., the controller 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 440 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 440 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 440, the main memory 404 and the processing device 402 also constituting machine-readable storage media.

In one embodiment, the instructions 426 include instructions to implement functionality corresponding to the host 102 and/or the memory device 103 of FIG. 1. While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
control circuitry coupled to a row decoder and a column decoder and configured to:
receive a plurality of access commands;
access an array of a memory device in response to one or more access commands of the plurality of access commands;
circuitry coupled to the control circuitry, the row decoder, and the column decoder and configured to:
identify a pattern or characteristic of the plurality of access commands;
transfer data between the array and a plurality of sense amplifiers of the memory device by providing signals to the row decoder and the column decoder; and
transfer the data between the plurality of sense amplifiers and a buffer internal to the memory device in an order that is based at least in part on the identified pattern or characteristic of the plurality of access commands.

2. The apparatus of claim 1, wherein the circuitry is further configured to identify the pattern or characteristic of the plurality of access commands by storing addresses corresponding to the plurality of access commands in registers and maintaining counters corresponding to the addresses.

3. The apparatus of claim 1, wherein the circuitry is further configured to, responsive to receipt of the one or more access commands of the plurality of access commands, determine that an address associated with the one or more access commands corresponds to the data stored in the buffer.

4. The apparatus of claim 3, wherein the circuitry is further configured to, responsive to determining that the address corresponds to the data stored in the buffer, provide access to the data stored in the buffer.

5. The apparatus of claim 1, wherein the circuitry is further configured to, responsive to receipt of the one or more access commands, determine that an address associated with the one or more access commands does not correspond to the data stored in the buffer.

6. The apparatus of claim 5, wherein the circuitry is further configured to, responsive to determining that the address does not correspond to the data stored in the buffer, provide access to the memory array.

7. The apparatus of claim 1, wherein the data comprises data that is likely to be accessed by a next received access command.

8. The apparatus of claim 7, wherein the circuitry is further configured to, responsive to receipt of the next access command:
process the plurality of access commands and the next received access command to identify different data that is statistically more likely to be accessed than the other data; and
transfer the different data from the memory array of the memory device to the buffer internal to the memory device.

9. An apparatus, comprising:
control circuitry coupled to a row decoder and a column decoder configured to:
receive a plurality of access commands;
access an array of a memory device in response to one or more access commands of the plurality of access commands;
circuitry coupled to the control circuitry, the row decoder, and the column decoder and configured to:
identify a pattern or characteristic of the plurality of access commands; and
transfer the data between the array of the memory device and a buffer internal to the memory device, by providing signals to the row decoder and the column decoder, in an order that is based at least in part on the identified pattern or characteristic of the plurality of access commands.

10. The apparatus of claim 9, wherein the circuitry is further configured to transfer the data between the array of memory device and the buffer via a number of data lines coupling sense amplifiers and the buffer where the sense amplifiers are coupled to the array.

11. The apparatus of claim 9, wherein the circuitry is further configured to identify the pattern responsive to intercepting the plurality of access commands.

12. The apparatus of claim 11, wherein the circuitry is further configured to intercept the plurality of access commands independent of the delivery of the plurality of access commands to the control circuitry.

13. The apparatus of claim 11, wherein the circuitry is further configured to receive the plurality of access commands independent of the control circuitry receiving the plurality of access commands.

14. The apparatus of claim 11, wherein the circuitry is further configured to intercept the plurality of access commands, data corresponding to the plurality of access commands, and address corresponding to the plurality of access commands.

15. An apparatus comprising:
control circuitry coupled to a row decoder and a column decoder and configured to:
 receive a plurality of access commands;
 access an array of a memory device in response to one or more access commands of the plurality of access commands;
circuitry coupled to the control circuitry, the row decoder, and the column decoder and configured to:
 identify a pattern of the plurality of access commands;
 transfer the data between the array and a buffer internal to the memory device, by providing signals to the row decoder and the column decoder, in an order that is based at least in part on the identified pattern of the plurality of access commands.

16. The apparatus of claim 15, wherein the control circuitry is further configured to identify the pattern of addresses of the plurality of access commands.

17. The apparatus of claim 16, wherein the control circuitry configured to identify the pattern of the addresses is further configured to identify a different order of the addresses of the plurality of commands.

18. The apparatus of claim 15, wherein the control circuitry is further configured to identify the pattern of the plurality of access commands, wherein the pattern comprises a threshold quantity of accesses to a portion of array.

19. The apparatus of claim 15, wherein the control circuitry is further configured to identify the pattern of the plurality of access commands, wherein the pattern is time dependent.

20. The apparatus of claim 15, wherein the control circuitry is further configured to identify the pattern of the plurality of access commands, wherein the pattern is command dependent.

* * * * *